(12) United States Patent
Kang et al.

(10) Patent No.: US 10,877,348 B2
(45) Date of Patent: Dec. 29, 2020

(54) ELECTROCHROMIC DEVICE

(71) Applicant: LG CHEM, LTD., Seoul (KR)

(72) Inventors: Soo Hee Kang, Daejeon (KR); Song Ho Jang, Daejeon (KR); Chung Wan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 178 days.

(21) Appl. No.: 15/774,773

(22) PCT Filed: Mar. 8, 2017

(86) PCT No.: PCT/KR2017/002491
§ 371 (c)(1),
(2) Date: May 9, 2018

(87) PCT Pub. No.: WO2017/155295
PCT Pub. Date: Sep. 14, 2017

(65) Prior Publication Data
US 2018/0373108 A1    Dec. 27, 2018

(30) Foreign Application Priority Data

Mar. 8, 2016  (KR) .................. 10-2016-0027597
Mar. 7, 2017  (KR) .................. 10-2017-0028748

(51) Int. Cl.
*G02F 1/155*    (2006.01)
*G02F 1/15*    (2019.01)
(Continued)

(52) U.S. Cl.
CPC ............ *G02F 1/1533* (2013.01); *B32B 9/005* (2013.01); *B32B 17/06* (2013.01); *B32B 27/36* (2013.01);
(Continued)

(58) Field of Classification Search
CPC ............ G02B 2027/014; G02B 26/026; G02B 27/017; G02B 27/0172; G02B 27/2207;
(Continued)

(56) References Cited

U.S. PATENT DOCUMENTS 4,303,310 A    12/1981  Morita et al.
5,253,100 A *  10/1993  Yang .................. G02F 1/15
                                            359/266
(Continued)

FOREIGN PATENT DOCUMENTS

JP    2012-98628 A    5/2012
KR    10-2003-0072123 A    9/2003
(Continued)

OTHER PUBLICATIONS

International Search Report (PCT/ISA/210) issued in PCT/KR2017/002491, dated May 23, 2017.

*Primary Examiner* — Brandi N Thomas
(74) *Attorney, Agent, or Firm* — Birch, Stewart, Kolasch & Birch, LLP

(57) ABSTRACT

The present application relates to an electrochromic device and a method for manufacturing the electrochromic device. The present application can provide an electrochromic device having increased productivity and improved electrochromic rate and durability, and a method for manufacturing the electrochromic device. The electrochromic device may be advantageously used in various devices such as smart windows, smart mirrors, displays, electronic papers and adaptive camouflage.

13 Claims, 9 Drawing Sheets

(51) Int. Cl.
| | |
|---|---|
| *G02F 1/153* | (2006.01) |
| *B32B 37/14* | (2006.01) |
| *C23C 14/34* | (2006.01) |
| *B32B 17/06* | (2006.01) |
| *C23C 14/00* | (2006.01) |
| *C23C 14/08* | (2006.01) |
| *B32B 27/36* | (2006.01) |
| *B32B 9/00* | (2006.01) |
| *C09K 9/00* | (2006.01) |
| *C09D 1/00* | (2006.01) |
| *C09D 5/24* | (2006.01) |
| *C09D 5/29* | (2006.01) |
| *B32B 37/18* | (2006.01) |
| *G02F 1/1516* | (2019.01) |
| *G02F 1/1524* | (2019.01) |

(52) U.S. Cl.
CPC .............. *B32B 37/144* (2013.01); *C09D 1/00* (2013.01); *C09D 5/24* (2013.01); *C09D 5/29* (2013.01); *C09K 9/00* (2013.01); *C23C 14/0036* (2013.01); *C23C 14/08* (2013.01); *C23C 14/083* (2013.01); *C23C 14/34* (2013.01); *G02F 1/155* (2013.01); *B32B 37/182* (2013.01); *B32B 2255/10* (2013.01); *B32B 2255/20* (2013.01); *B32B 2255/26* (2013.01); *B32B 2307/202* (2013.01); *B32B 2307/412* (2013.01); *B32B 2307/72* (2013.01); *B32B 2315/02* (2013.01); *B32B 2315/08* (2013.01); *B32B 2367/00* (2013.01); *B32B 2551/00* (2013.01); *G02F 1/1524* (2019.01); *G02F 1/15165* (2019.01); *G02F 2001/1552* (2013.01); *G02F 2001/1555* (2013.01); *G02F 2001/164* (2019.01)

(58) Field of Classification Search
CPC ............ G02B 27/2221; G02B 27/2228; G02B 27/2264; G02B 2027/0118; G02B 2027/0134; G02B 2027/0138; G02B 2027/0178
USPC ........ 359/237, 242, 265–267, 270–273, 315, 359/322
See application file for complete search history.

(56) References Cited

U.S. PATENT DOCUMENTS

| | | | |
|---|---|---|---|
| 2007/0097483 | A1 | 5/2007 | Park |
| 2012/0113496 | A1* | 5/2012 | Ueda ..................... G02F 1/153 359/275 |
| 2014/0063584 | A1* | 3/2014 | Shi ....................... G02F 1/1523 359/265 |
| 2015/0185580 | A1 | 7/2015 | Cho et al. |

FOREIGN PATENT DOCUMENTS

| | | |
|---|---|---|
| KR | 10-2007-0047597 A | 5/2007 |
| KR | 10-2008-0051280 A | 6/2008 |
| KR | 10-2015-0076780 A | 7/2015 |

* cited by examiner

[Figure 1]
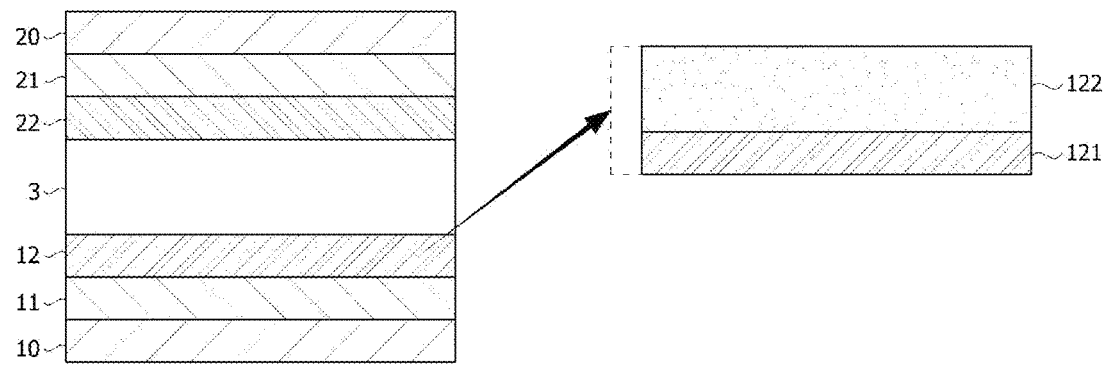
[Figure 2]
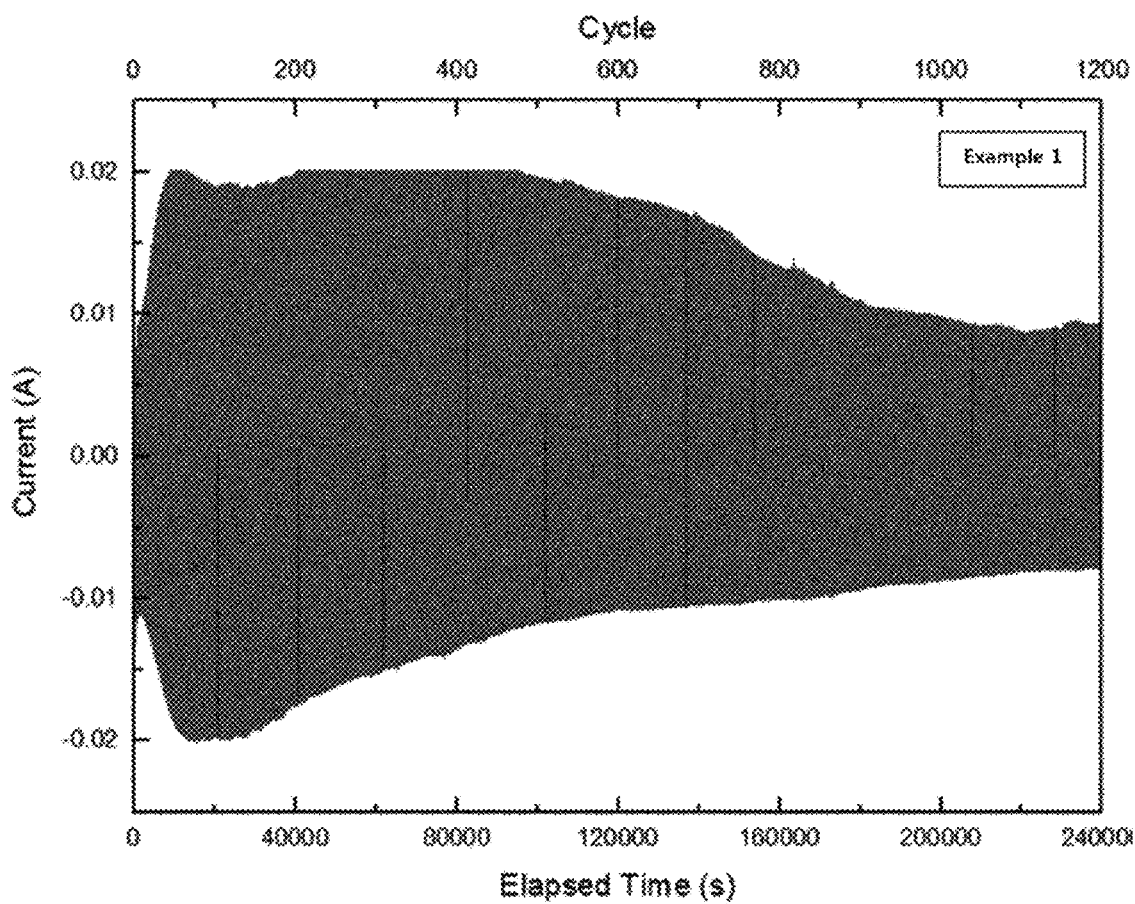

[Figure 3]
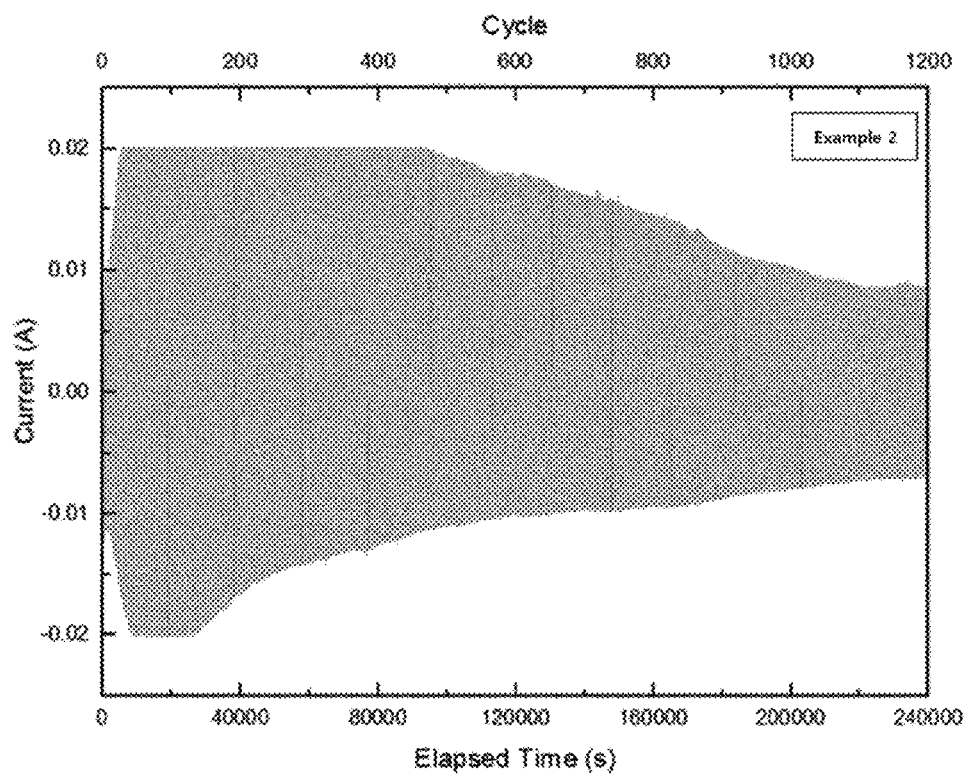
[Figure 4]
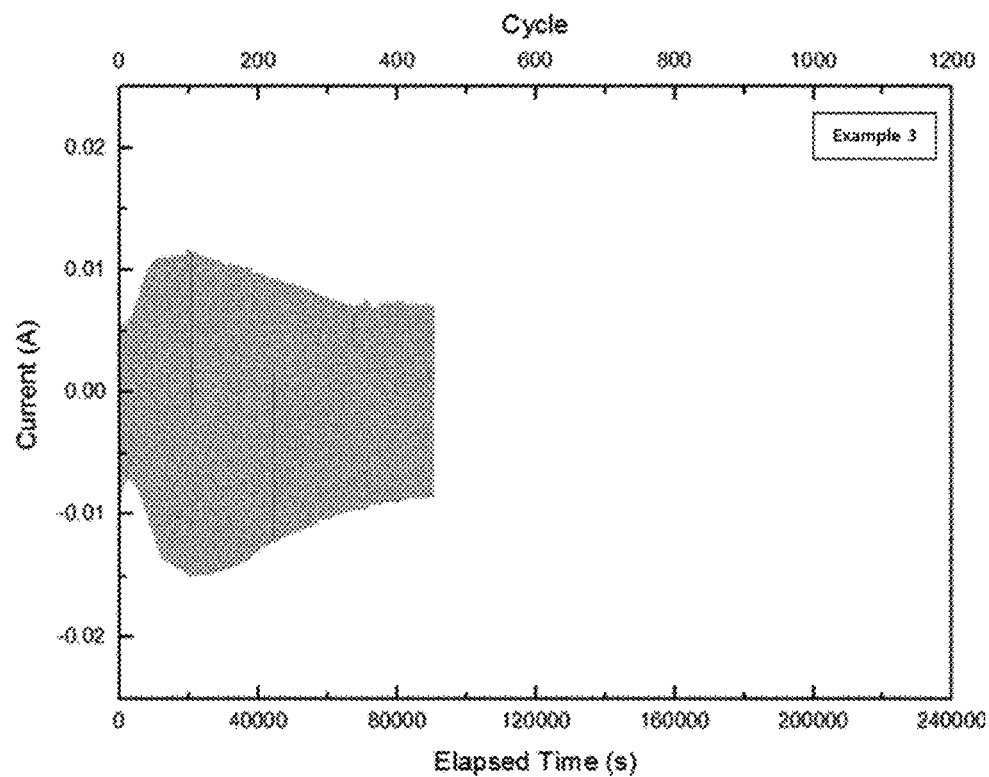

[Figure 5]
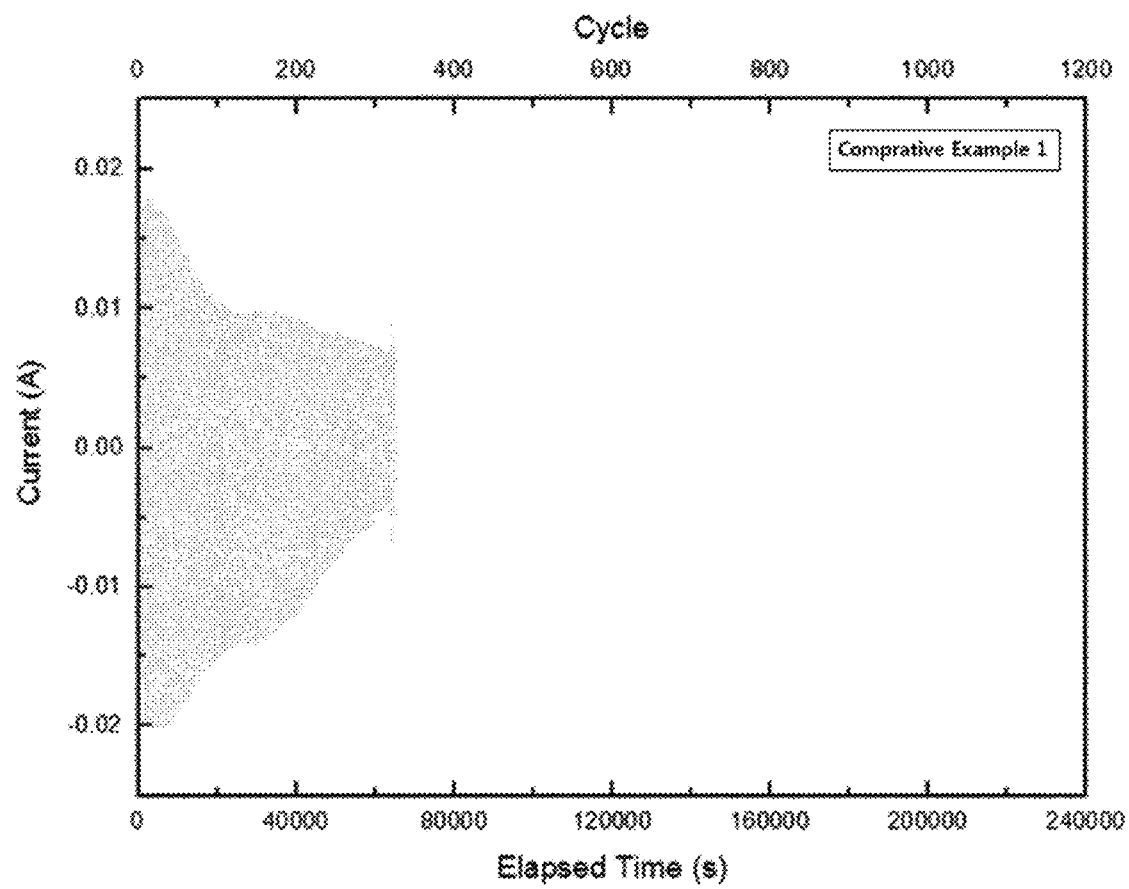
[Figure 6]
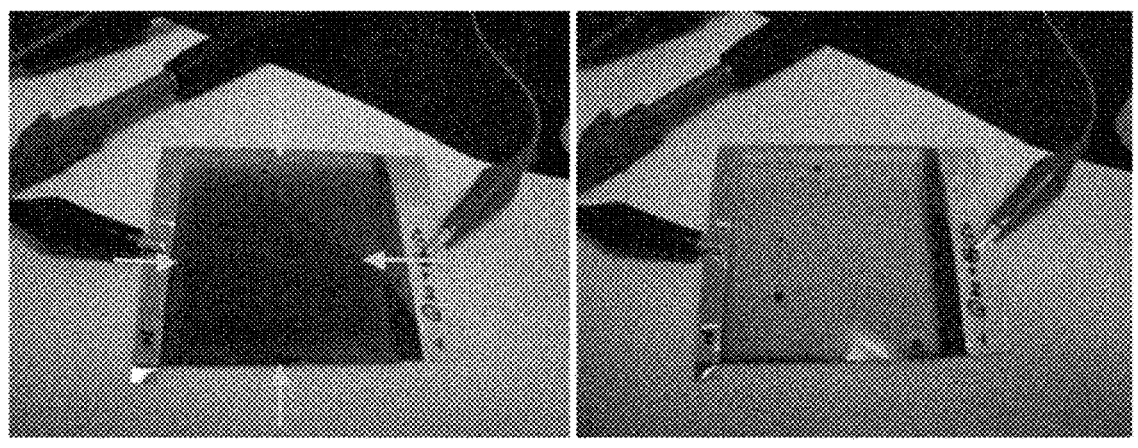
750 cycle coloring (Example 1)　　　　　　750 cycle bleaching (Example 1)

[Figure 7]
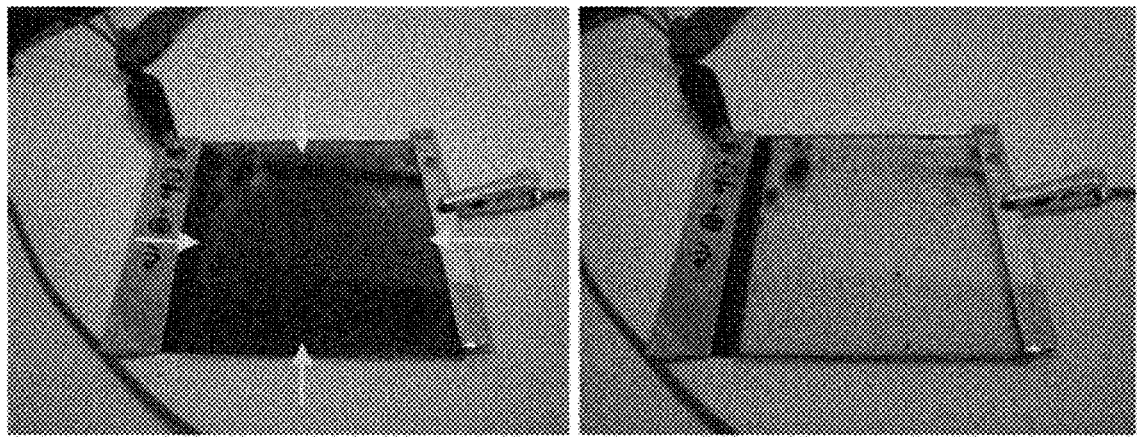
750 cycle coloring (Example 2)      750 cycle bleaching (Example 2)
[Figure 8]
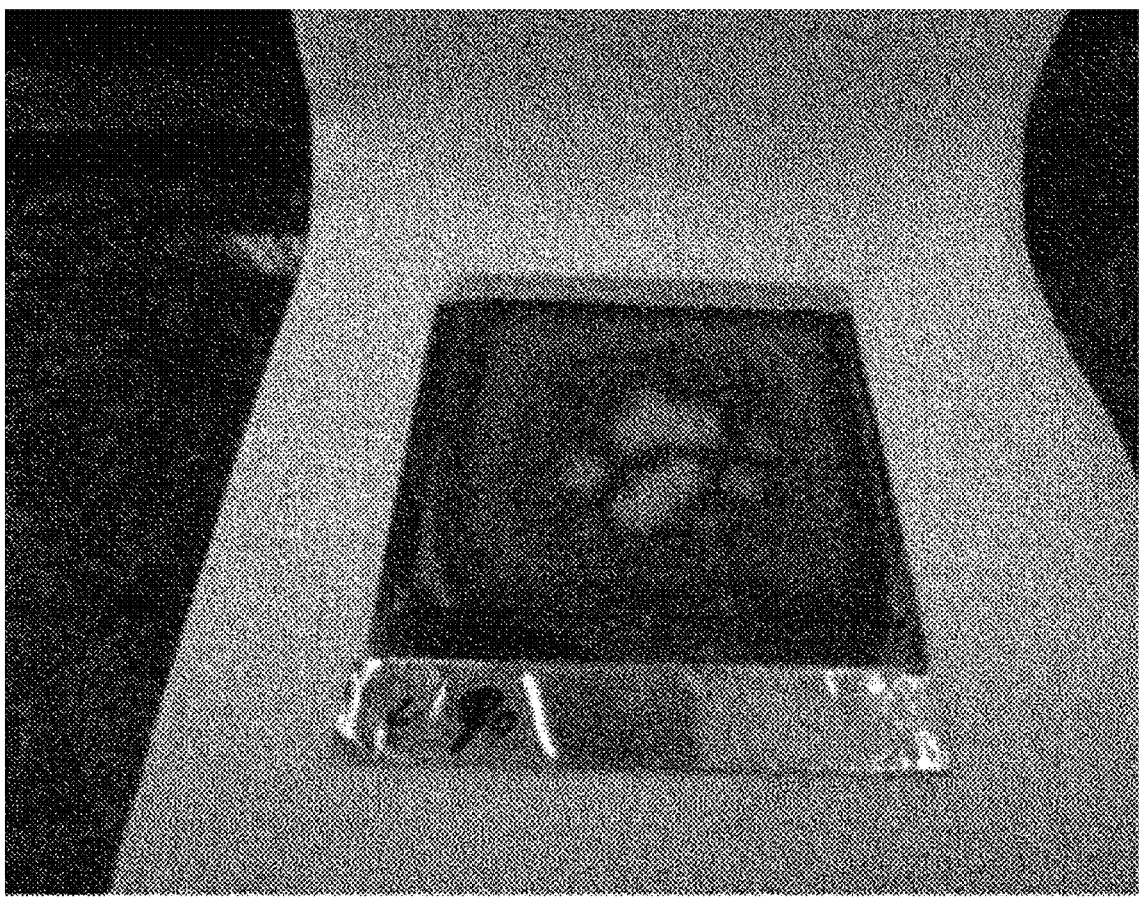
400 cycle coloring (Example 3)

[Figure 9]
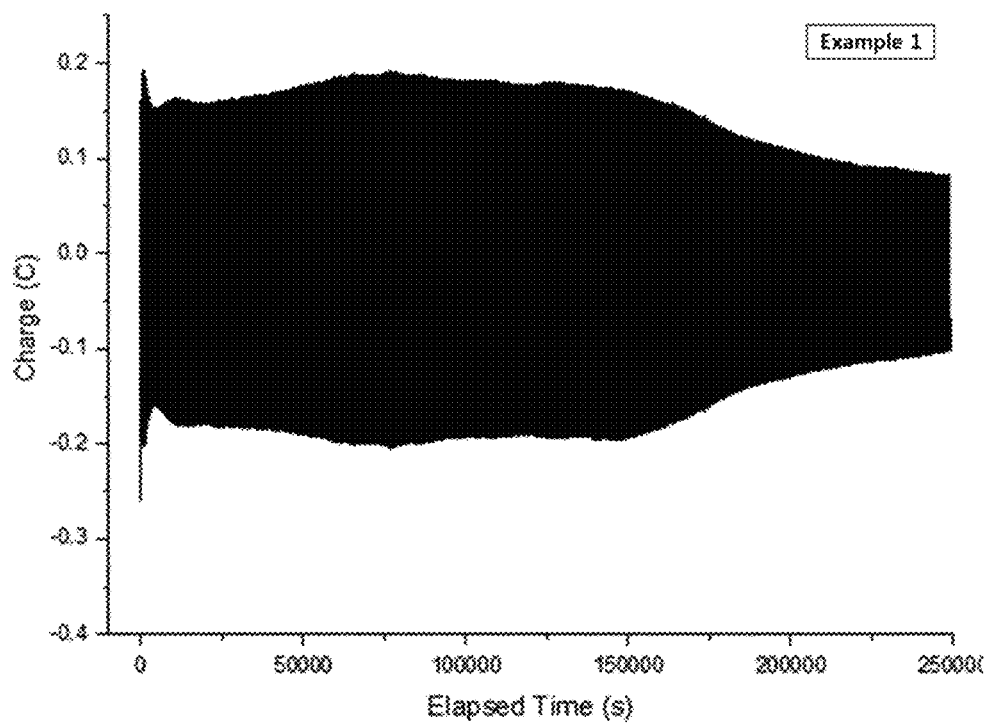
[Figure 10]
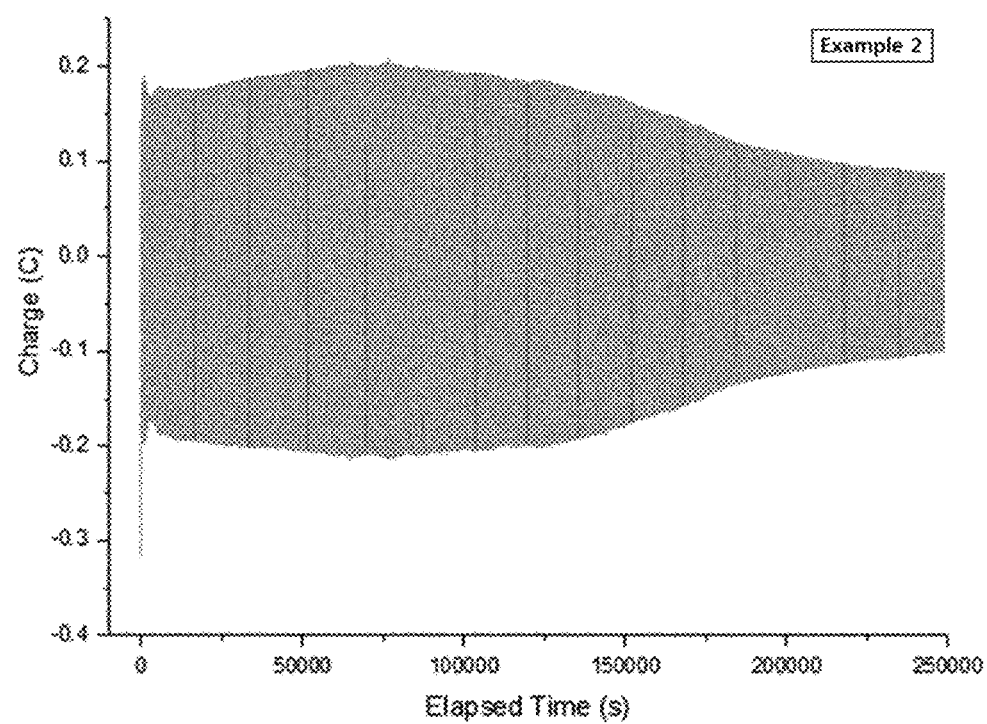

[Figure 11]
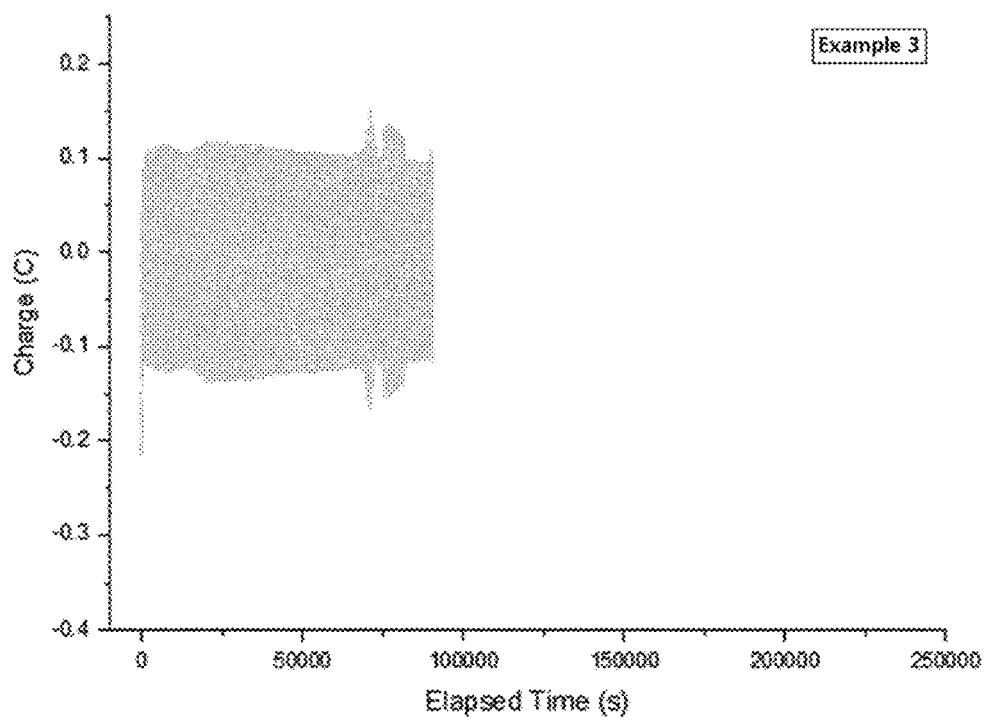
[Figure 12]
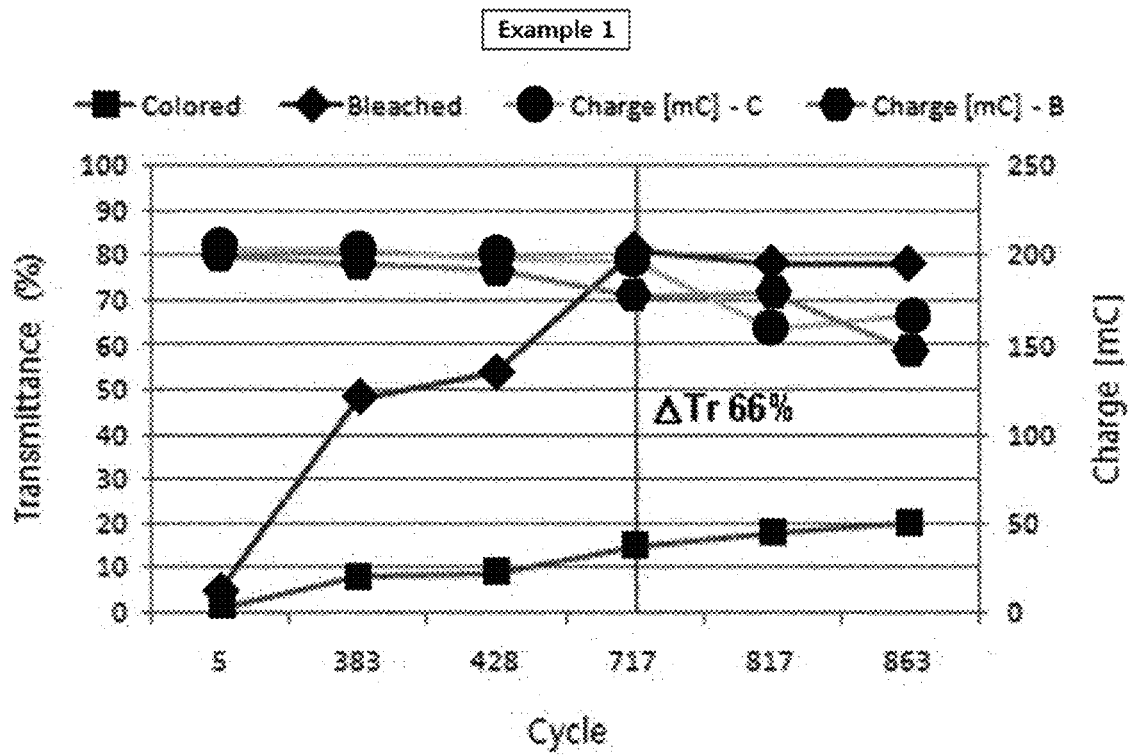

[Figure 13]
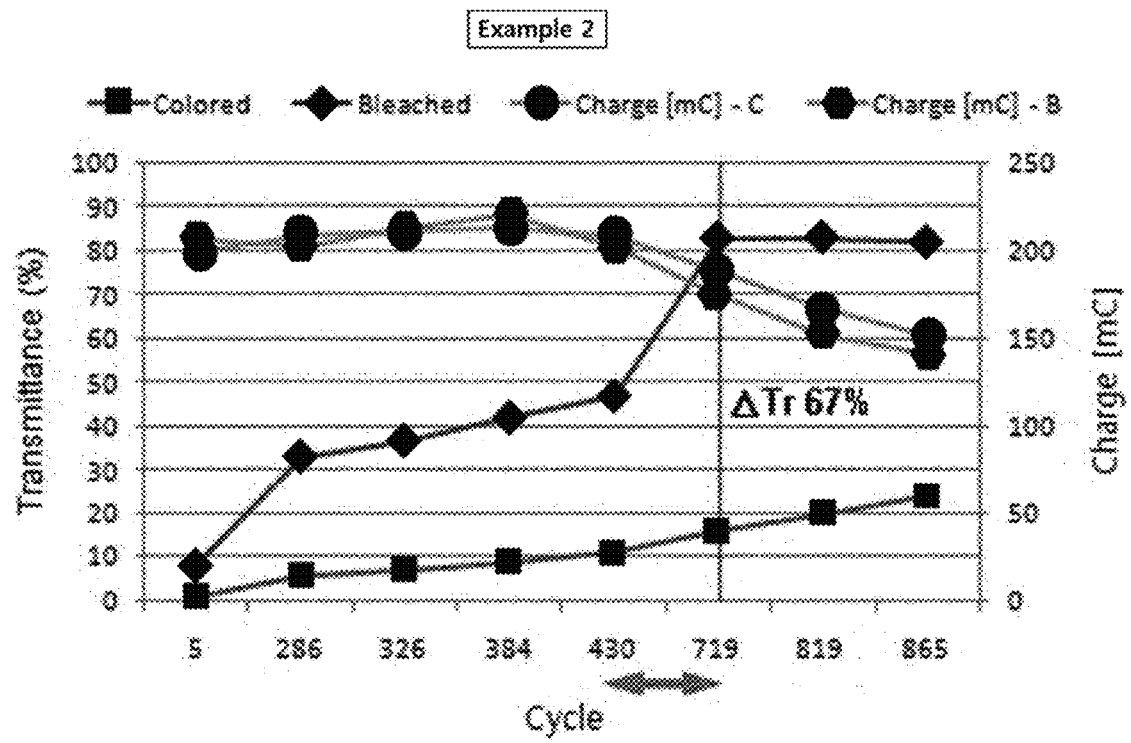
[Figure 14]
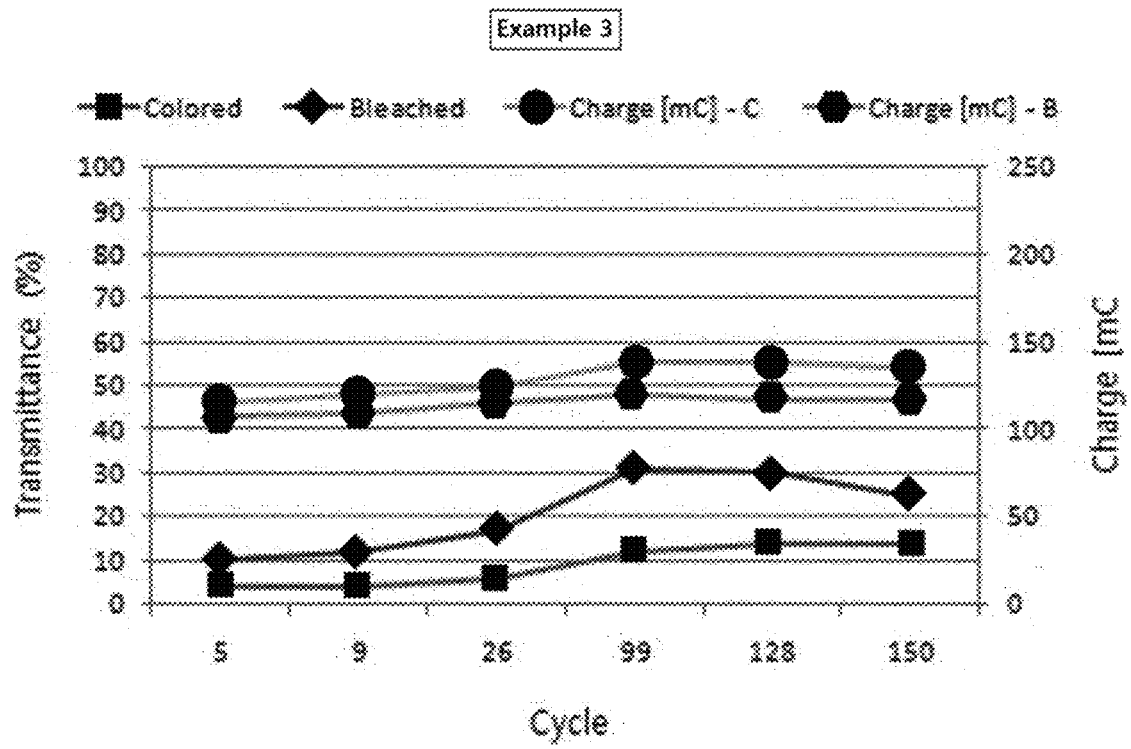

[Figure 15]
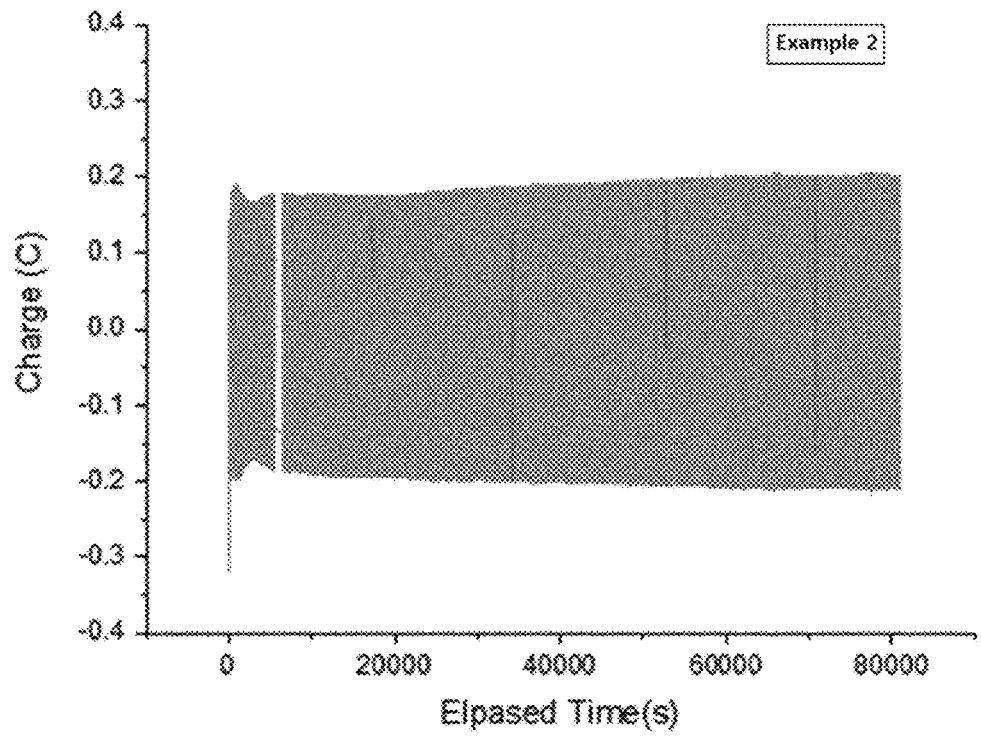
[Figure 16]
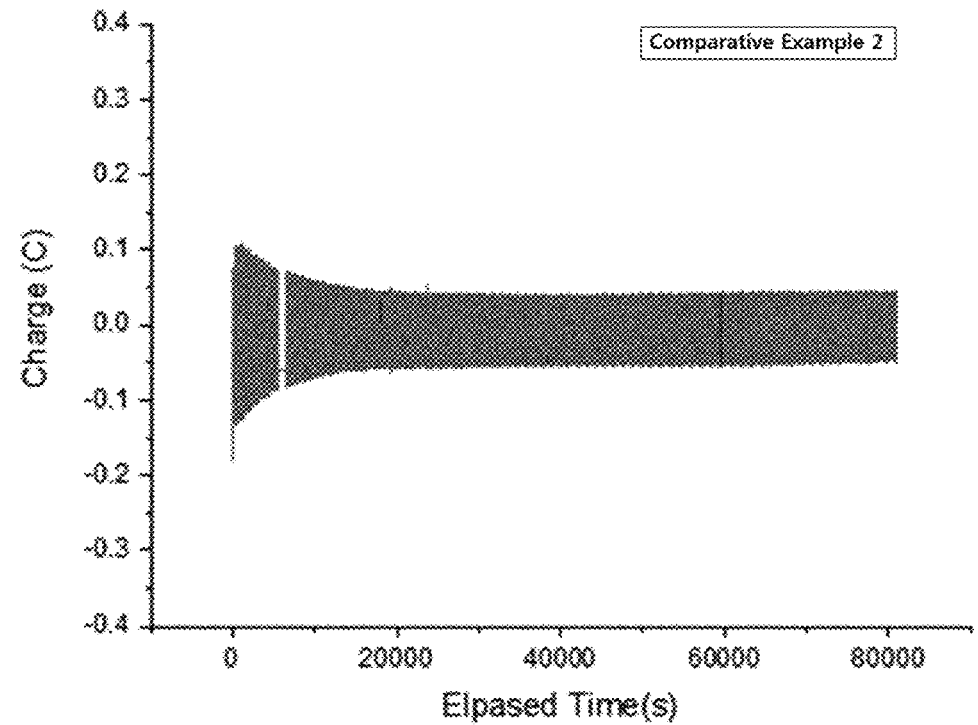

[Figure 17]
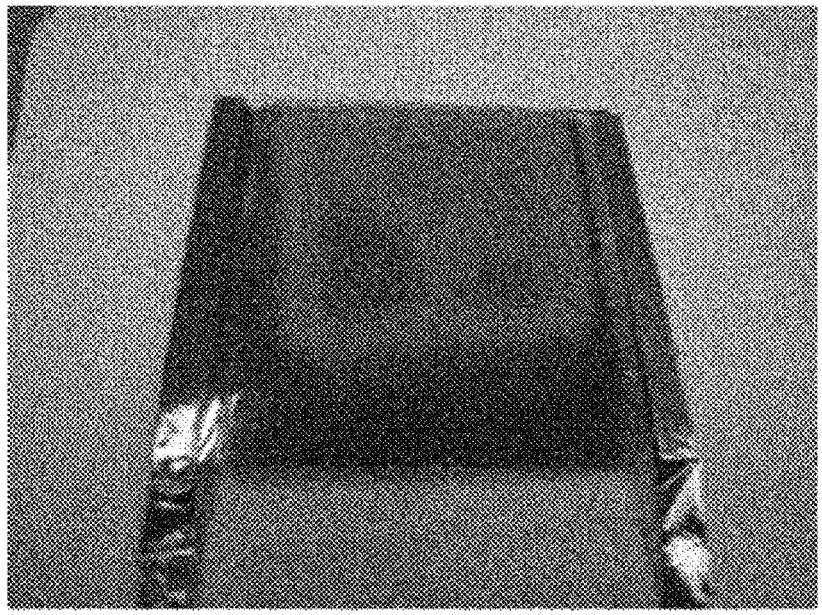
50 cycle coloring (Comparative Example 2)
[Figure 18]
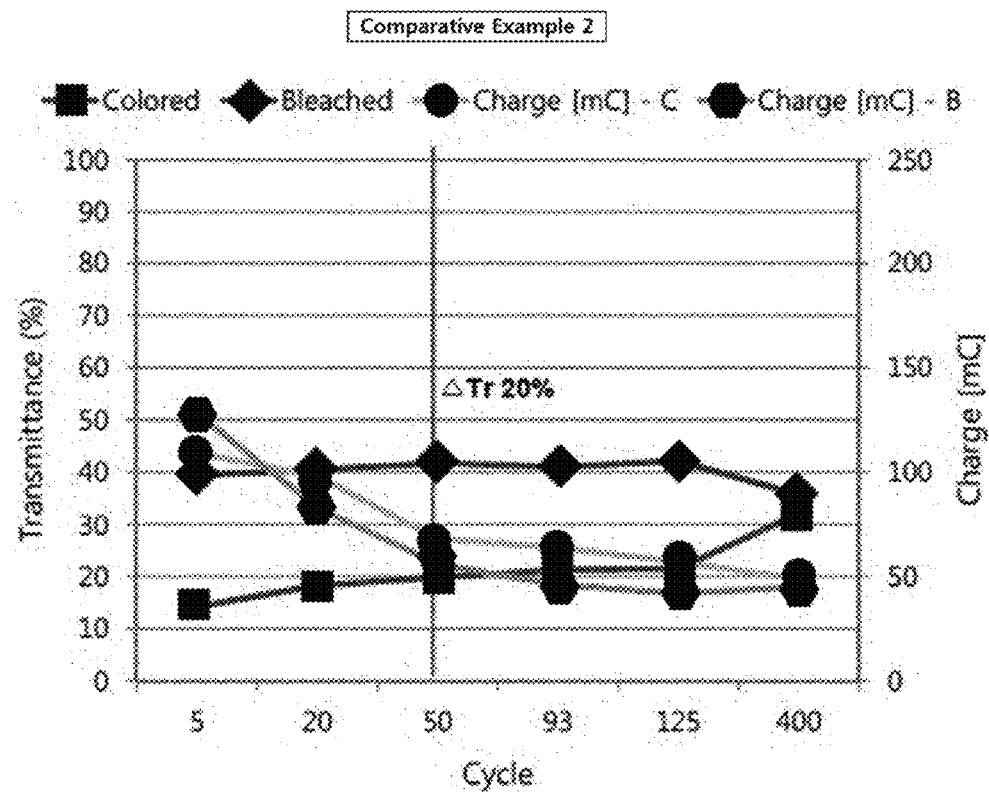

ELECTROCHROMIC DEVICE

TECHNICAL FIELD

The present application relates to an electrochromic device and a use of the electrochromic device.

The present application claims the benefit of priority based on Korean Patent Application No. 10-2016-0027597 filed on Mar. 8, 2016 and Korean Patent Application No. 10-2017-0028748 filed on Mar. 7, 2017, the disclosures of which are incorporated herein by reference in their entireties.

BACKGROUND ART

Electrochromism refers to a phenomenon in which optical properties such as color or transmittance of an electrochromic active material are changed by an electrochemical redox reaction of materials. The electrochromic device using such a phenomenon can be manufactured into devices with a large area even at a small cost and has a low power consumption, so that it can be used in various fields such as a smart window, a smart mirror, and an electronic paper (Patent Document 1: Korean Laid-Open Patent Publication No. 2008-0051280).

As the electrochromic material, a transition metal oxide can be exemplified. For example, $WO_3$, $MoO_3$, $TiO_2$ and the like can be exemplified as a chromogenic material by reduction, and LiNiOx, NIOx, $V_2O_5$, $IrO_2$ and the like can be exemplified as a chromogenic material by oxidation.

In order to apply the electrochromic material to an electrochromic device, it is necessary to provide the electrochromic material in the form of a thin film. In one example, the electrochromic material may be thinned using sputter vacuum equipment. However, the vacuum deposition method has a high unit process cost and maintenance cost and although a thin film having a thickness of several hundred nanometers is required for stable driving of the electrochromic device, it has a low deposition rate, whereby there is a problem that it is difficult to apply it upon mass production. As an alternative to the vacuum deposition method, there is a method of coating an electrochromic material. The coating method has a simple process as compared to the vacuum deposition method and thus has the effect of reducing the process cost, but an additional process such as treatment processing may also be required due to reduction of adhesion between a coating layer and a base material.

On the other hand, in the field of electrochromic devices, it is required to maintain stable electrochromic characteristics and have thermal stability and durability during a cycling test. Furthermore, when the electrochromic device is degraded, there are problems that the electrochromic properties are lowered or are not realized and deterioration is visually observed and thus, it is necessary to improve the electrochromic stability in order to use it in a smart window or the like.

DISCLOSURE

Technical Problem

It is an object to be solved by the present application, for increasing productivity of the electrochromic device and solving and compensating the problem of process stability due to materials, to provide an electrochromic device having improved productivity, electrochromic rate and durability, and a method for manufacturing the same.

Technical Solution

The present application relates to an electrochromic device. The electrochromic device of the present application may sequentially comprise a first electrode layer, a composite electrochromic layer, an electrolyte layer, an ion storage layer, and a second electrode layer. The composite electrochromic layer may comprise a laminate structure of a plurality of electrochromic layers. At least two electrochromic layers among the plurality of electrochromic layers may have different densities. The electrochromic layer having a higher density among the two electrochromic layers having different densities may be disposed closer to the first electrode layer as compared to the electrochromic layer having a lower density. The first and second electrode layers may be provided on the first and second substrates, respectively.

The electrochromic device of the present application can be implemented through the laminate structure of the electrochromic layers having a relatively small thickness, so that the productivity can be increased. In addition, the electrochromic device of the present application can reduce a degradation phenomenon due to the side reaction of ions in the electrolyte layer and the electrode layer materials (for example, ITO) by preventing the ions (for example, $Li^+$ ions) in the electrolyte layer from penetrating into the electrode layer through the arrangement of a plurality of electrochromic layers having different densities, thereby exhibiting excellent electrochromic rate and durability.

FIG. 1 illustratively shows an electrochromic device according to one embodiment of the present application. As shown in FIG. 1, the electrochromic device according to one embodiment of the present invention may sequentially comprise a first substrate (10), a first electrode layer (11), a composite electrochromic layer (12), an electrolyte layer (3), an ion storage layer (22), a second electrode layer (21) and a second substrate (20). The composite electrochromic layer (12) may comprise at least two electrochromic layers (121, 122) having different densities and the first electrochromic layer (121) having the higher density may be disposed closer to the first electrode layer (11) than the second electrochromic layer having the lower density. In the electrochromic device according to FIG. 1, the first electrochromic layer (121) having the higher density is adjacent to the first electrode layer (11) and the second electrochromic layer (122) having the lower density is adjacent to the electrolyte layer (3).

Hereinafter, the electrochromic device of the present application will be specifically described.

[Electrode Layer]

In this specification, the electrode layer adjacent to the composite electrochromic layer may be referred to as a first electrode layer, and the electrode layer adjacent to the ion storage layer may be referred to as a second electrode layer. The first and second electrode layers may function to supply electric charges to the composite electrochromic layer or the ion storage layer. The first electrode layer may be referred to as an electrode adjacent having an electrochromic action in the electrochromic device while being adjacent to the composite electrochromic layer, for example, an active electrode. The second electrode layer may be referred to as an electrode capable of accommodating hydrogen or lithium ions, etc., which are desorbed from the active electrode, while being adjacent to the ion storage layer, for example, a counter electrode. However, as described below, when the ion storage layer also comprises an electrochromic material, both the first electrode layer and the second electrode layer may function as counter electrodes while being active electrodes.

The first and second electrode layers may each comprise a transparent conductive material. Specifically, the first and second electrode layers may each comprise at least one of a transparent conductive oxide, a conductive polymer, a silver nanowire, and a metal mesh. In one example, as the transparent conductive oxide, ITO (indium tin oxide), FTO (fluor doped tin oxide), AZO (aluminum doped zinc oxide), GZO (gallium doped zinc oxide), ATO (antimony doped tin oxide), IZO (indium doped zinc oxide), NTO (niobium doped titanium oxide), ZnO, or CTO and the like can be used, without being limited thereto. In another example, the first and second electrode layers may be formed in a structure in which two or more materials of the above-mentioned transparent conductive oxides are laminated.

The first or second electrode layer can be produced, for example, by forming an electrode material containing transparent conductive oxide particles in a thin film form on a transparent glass substrate through a process such as sputtering or digital printing.

The physical properties of the first or second electrode layer can be appropriately adjusted within a range without impairing the purpose of the present application. In one example, the first or second electrode layer may be designed to have a low thickness and sheet resistance and a high transmittance. The lower the sheet resistance of the first or second electrode layer is, the more the coloring and bleaching conversion time of the electrochromic device tends to decrease. Considering this point, the physical properties of the first or second electrode layer can be appropriately controlled. For example, the first or second electrode layer may have a thickness of 1 nm to 500 nm.

The voltage applied to the first or second electrode layer through an external circuit can be appropriately adjusted within a range without impairing the purpose of the present application. The higher the voltage applied to the first or second electrode layer, the better the characteristics of the electrochromic device, but the durability may be lowered by accelerating the degradation of the device. Considering this point, the voltage applied to the first or second electrode layer through the external circuit can be appropriately adjusted. For example, the voltage applied to the first or second electrode layer through the external circuit may be −5 V to +5 V, but is not limited thereto. In addition, the voltages at the time of coloring and bleaching may be the same or different, which may be appropriately adjusted, if necessary. The voltage may be applied by an alternating current power source, and the power source or the method of applying the voltage may be appropriately selected by those skilled in the art.

As shown in FIG. 1, the electrochromic device of the present application may further comprise first and second substrates disposed on one surface of the first and second electrode layers, respectively. The first and second substrates may be a glass substrate or a polymer substrate, respectively. Specifically, each of the first and second substrates may be any one selected from the group consisting of glass, glass fiber, polyethylene terephthalate, polyethylene naphthalate, polycarbonate, polyethersulfone, polyimide and a combination thereof. According to one embodiment of the present application, the first substrate may be a glass substrate and the second substrate may be a polymer substrate.

[Composite Electrochromic Layer]

The composite electrochromic layer may have a laminate structure of a plurality of electrochromic layers. In this specification, the laminate structure of a plurality of electrochromic layers may mean a laminate structure of at least two electrochromic layers. In this specification, with referring to the electrochromic layer, unless it is defined as "composite" or "plurality," the electrochromic layer may mean a single electrochromic layer which is independently formed. The composite electrochromic layer may have a laminate structure of two, three, four, five or more electrochromic layers, if necessary.

At least two electrochromic layers among the plurality of electrochromic layers may have densities different from each other. The electrochromic layer having the higher density among the two electrochromic layers having different densities may be arranged closer to the first electrode layer than the electrochromic layer having the lower density. By preventing the ions (for example, $Li^+$ ions) in the electrolyte layer from penetrating into the electrode layer through the above arrangement, it is possible to reduce the degradation phenomenon due to side reactions of the ions in the electrolyte layer and the electrode layer materials (for example, ITO) and thus to exhibit excellent electrochromic rate and durability.

In one example, when the composite electrochromic layer has a laminate structure of two electrochromic layers having different densities, the electrochromic layer having the higher density may be disposed adjacent to the first electrode layer, and the layer having the lower density may be disposed adjacent to the electrolyte layer. In another example, when the composite electrochromic layer has a laminate structure of three or more electrochromic layers having different densities, the electrochromic layer having the highest density may be disposed adjacent to the first electrode layer, and the electrochromic layer having the lowest density may be disposed adjacent to the electrolyte layer. Also, the electrochromic layers may be disposed so that the density of the electrochromic layers becomes lower toward the electrolyte layer side from the first electrode layer side.

The plurality of electrochromic layers may be arranged such that, for example, at least two electrochromic layers having different densities are adjacent to each other. Therefore, according to the electrochromic device of the present application, at least two electrochromic layers having different densities can be driven in a state to be adjacent to each other.

The plurality of electrochromic layers, for example, at least two electrochromic layers having different densities may be directly laminated to each other. In this specification, the phrase "A and B are directly laminated to each other" may mean that they are laminated to each other in the absence of an intermediate layer such as a pressure-sensitive adhesive layer or an adhesive layer between A and B. The direct lamination of the two or more electrochromic layers may be performed, for example, by depositing or coating another electrochromic layer on one electrochromic layer.

The difference in density of the two electrochromic layers having different densities can be appropriately selected in consideration of the purpose of the present application. In one example, the density difference may be 0.1 $g/cm^3$ or more, 0.2 $g/cm^3$ or more, 0.3 $g/cm^3$ or more, 0.4 $g/cm^3$ or more, or 0.5 $g/cm^3$ or more. The upper limit of the density difference may be 3.0 $g/cm^3$ or less. When the density difference of the two electrochromic layers having different densities is in the above range, it may be advantageous in terms of having increased productivity and realizing an electrochromic device having excellent electrochromic rate and durability.

Each density in the two electrochromic layers having different densities may be appropriately selected in consideration of the purpose of the present application. In one example, the electrochromic layer having the higher density among the two electrochromic layers having different densities may have a density of 5.0 g/cm$^3$ to 8.0 g/cm$^3$. Specifically, the electrochromic layer having the higher density may have a density of 5.0 g/cm$^3$ or more, 5.25 g/cm$^3$ or more, 5.5 g/cm$^3$ or more, 5.75 g/cm$^3$ or more, 6 g/cm$^3$ or more, or 6.25 g/cm$^3$ or more, and 8.0 g/cm$^3$ or less, 7.5 g/cm$^3$ or less, 7.0 g/cm$^3$ or less, or 6.5 g/cm$^3$ or less. The electrochromic layer having the lower density among the two electrochromic layers having different densities may have a density of 3.0 g/cm$^3$ to 7.0 g/cm$^3$. Specifically, the electrochromic layer having the lower density may have a density of 3.0 g/cm$^3$ or more, 3.5 g/cm$^3$ or more, 4.0 g/cm$^3$ or more, 4.5 g/cm$^3$ or more, or 5.5 g/cm$^3$ or more, and 7.0 g/cm$^3$ or less, 6.5 g/cm$^3$ or less, or 6.0 g/cm$^3$ or less. When each density in the electrochromic layers is in the above range, it may be advantageous in terms of having increased productivity and realizing an electrochromic device having an excellent electrochromic rate and durability.

The thickness of the individual electrochromic layers included in the composite electrochromic layer can be suitably selected in consideration of the purpose of the present application. In one example, the individual electrochromic layers may have a thickness of 10 nm to 800 nm, respectively. Specifically, the electrochromic layer having the higher density among the two electrochromic layers having different densities may have a thickness of 10 nm to 800 nm, and the electrochromic layer having the lower density may have a thickness of 10 nm to 800 nm. More specifically, the electrochromic layer having the higher density may have a thickness of 10 nm or more, 20 nm or more, 30 nm or more, 60 nm or more, or 90 nm or more, and 400 nm or less, 300 nm or less, 200 nm or less, or 100 nm or less. More specifically, the electrochromic layer having the lower density may have a thickness of 10 nm or more, 50 nm or more, 100 nm or more, 150 nm or more, and 400 nm or less, 300 nm or less, or 200 nm or less. Furthermore, the total thickness of the composite electrochromic layer may be 20 nm to 810 nm. More specifically, the total thickness of the composite electrochromic layer may be 20 nm or more, 60 nm or more, 100 nm or more, 140 nm or more, 180 nm or more, and 810 nm or less, 700 nm or less, 600 nm or less, 500 nm or less, 400 nm or less, or 300 nm or less. When the thickness of the composite electrochromic layer satisfies the above range, it may be advantageous in terms of having increased productivity and realizing an electrochromic device having an excellent electrochromic rate and durability.

At least two electrochromic layers having different densities may be implemented through different physical structures. In one example, any one of the at least two electrochromic layers having different densities may be a porous film. In one specific example, the electrochromic layer having the lower density among the at least two electrochromic layers having different densities may be a porous film as compared to the electrochromic layer having the higher density. In this specification, the porous film may mean a film having a porous structure, that is, a film having a structure in which a plurality of pores (porosity) exist in the inside or the surface of the film. In this specification, the phrase "A is a porous film as compared to B" may mean that A contains more pores than B.

The plurality of electrochromic layers, for example, at least two electrochromic layers having different densities may each comprise an electrochromic material. Electrochromism is a phenomenon in which colors change reversibly depending on an electrical signal and the electrochromism can be generated by the process of inserting/extracting electrons and ions (H$^+$, Li$^+$, etc.) into an electrochromic material. The electrochromic material can be classified as a reductively electrochromic material which is reversibly colored by ion implantation and an oxidatively electrochromic material which is reversibly colored by ion extraction.

As the electrochromic material, a metal oxide electrochromic material, a metal complex compound, an organic electrochromic material, or a conductive polymer electrochromic material and the like can be used.

As an example of the metal oxide electrochromic material, one or more of metal oxides of tungsten (W), titanium (Ti), vanadium (V), molybdenum (Mo), niobium (Nb), chromium (Cr), manganese (Mn), iron (Fe), nickel (Ni), cobalt (Co), iridium (Ir) and lithium nickel (LiNi) can be used. Metal oxides of tungsten (W), titanium (Ti), vanadium (V), molybdenum (Mo), niobium (Nb) and the like can be classified as the reductively electrochromic material, and vanadium (V), chromium (Cr), manganese (Mn), tantalum (Ta), iron (Fe), nickel (Ni), cobalt (Co), iridium (Ir) or lithium nickel (LiNi) and the like can be classified as the oxidatively electrochromic material.

As the metal complex compound, for example, Prussian blue, phthalocyanines or bismuth and the like can be used.

As the organic electrochromic material, for example, viologen or quinone and the like can be used.

As the conductive polymer electrochromic material, for example, one or more of polythiophene, polyaniline, polypyrrole, polyanthracene, polyfluorene, polycarbazole, polyphenylenevinylene and a derivative thereof can be used.

In one example, the plurality of electrochromic layers, for example, at least two electrochromic layers having different densities may each comprise the same kind of electrochromic material. As one example, at least two electrochromic layers having different densities may each comprise tungsten oxide (WOx). The electrochromic device of the present application realizes so that at least two electrochromic layers comprising the same kind of electrochromic material have densities different from each other, whereby the productivity of the electrochromic device can be increased and the problem of the process stability due to the material can be solved and compensated.

[Ion Storage Layer]

The ion storage layer may serve to accept and release charges of the ions necessary to cause the electrochromic layer to discolor. Accordingly, in order to match a charge balance between the ion storage layer and the electrochromic layer, the ion storage layer may comprise a conductive material complementary to the electrochromic layer.

The ion storage layer may comprise an oxidatively conductive material when the composite electrochromic layer comprises a reductively electrochromic material. Alternatively, the ion storage layer may comprise a reductively conductive material when the composite electrochromic layer comprises an oxidatively electrochromic material.

As one example, the conductive material included in the ion storage layer may be an electrochromic material. When the composite electrochromic layer comprises a reductively electrochromic material, the ion storage layer may comprise an oxidatively electrochromic material. When the composite electrochromic layer comprises an oxidatively electrochromic material, the ion storage layer may comprise a reductively electrochromic material. According to one embodiment of the present application, when tungsten oxide ($WO_3$) is used in the composite electrochromic layer, lithium nickel oxide ($LiNixOy$) can be used in the ion storage layer.

Alternatively, the ion storage layer may also comprise a suitable conductive material, for example, a conductive material such as conductive graphite, regardless of whether the composite electrochromic layer contains a reductive discoloring material or an oxidative discoloring material.

The thickness of the ion storage layer can be suitably selected within a range without impairing the purpose of the present application. For example, the ion storage layer may have a thickness of 20 nm to 810 nm. When the thickness of the ion storage layer satisfies the above range, it is possible to provide an electrochromic device having improved electrochromic rate and stability.

[Electrolyte Layer]

The electrolyte layer may comprise an electrolyte salt. Specifically, the electrolyte layer may be any one selected from the group consisting of a liquid electrolyte in which an electrolytic salt is dissolved, a gel electrolyte, a solid electrolyte, a polymer electrolyte and a gel polymer electrolyte. In the case of a liquid electrolyte, it may be one in which an electrolytic salt is dissolved in a solvent. According to one embodiment of the present application, the electrolyte may be a gel polymer electrolyte.

The electrolyte salt may be an organic electrolyte salt or an inorganic electrolyte salt. More specifically, the electrolyte salt may comprise a lithium salt, a potassium salt, a sodium salt or an ammonium salt, and the like and the electrolyte salt may be, for example, any one selected from the group consisting of n-$Bu_4NClO_4$, n-$Bu_4NPF_6$, $NaBF_4$, $LiClO_4$, $LiPF_6$, $LiBF_4$, $LiN(SO_2C_2F_5)_2$, $LiCF_3SO_3$, $C_2F_6LiNO_4S_2$, $K_4Fe(CN)_6$, and a combination thereof.

The solvent may be applied, if it is a non-aqueous solvent, and specifically may be any one selected from the group consisting of dichloromethane, chloroform, acetonitrile, ethylene carbonate (EC), propylene carbonate (PC), tetrahydrofuran (THF), butylene carbonate, and a combination thereof.

The thickness of the electrolyte layer can be appropriately selected within a range without impairing the purpose of the present application. For example, the electrolyte layer may have a thickness of 400 nm to 2000 nm. When the thickness of the electrolyte layer satisfies the above range, it is possible to provide an electrochromic device having improved electrochromic rate and stability.

The present application also relates to a method for manufacturing an electrochromic device. The manufacturing method may be the method for manufacturing the above described electrochromic device. The manufacturing method may comprise a process of sequentially laminating on a first electrode layer a composite electrochromic layer, an electrolyte layer, an ion storage layer and a second electrode layer. In the manufacturing method, the composite electrochromic layer may comprise a plurality of electrochromic layers, in which at least two electrochromic layers among the plurality of electrochromic layers have densities different from each other, and among the two electrochromic layers having different densities, the electrochromic layer having the higher density may be laminated so as to be arranged adjacent to the first electrode layer as compared to the electrochromic layer having the lower density. In the manufacturing method, the details of the first electrode layer, the composite electrochromic layer, the electrolyte layer, the ion storage layer, and the second electrode layer can be equally applied by the contents described in the item of the electrochromic device.

In the manufacturing method, the interlayer laminating method may be performed by appropriately selecting known methods. In one example, each layer can be formed using any one method of sputtering, a sol-gel method, electron beam evaporation (e-beam evaporation), pulsed laser deposition, CVD (chemical vapor deposition), spin coating, and dip coating.

In the manufacturing method, the adjustment of density in at least two electrochromic layers to be different from each other can be performed by laminating any one electrochromic layer in the form of a porous film as compared to other adjacent electrochromic layers. The details of the porous film can be equally applied by the contents described in the item of the electrochromic device.

In one example, the lamination of the electrochromic layer in the form of a porous film can be performed, in laminating the electrochromic layer, by applying a sputtering process thereto, with a proviso that the process pressure condition is adjusted, or by applying an electron beam evaporation (E-beam evaporation) process thereto, with a proviso that the gas condition is adjusted. The process pressure condition in the sputtering process or the gas condition in the electron beam deposition process can be appropriately selected according to the density to be implemented.

As one example, when the sputtering process is applied, the density of the electrochromic layer tends to decrease as the process pressure increases. Alternatively, when the electron beam evaporation process is applied, the density of the electrochromic layer tends to decrease as the process pressure increases through gas injection. On the other hand, since the source of the sputtering process is a rigid solid of a metal component and the source of the electron beam evaporation process is a granule type solid, there may be a difference in the density on processes due to the difference in sputtering and electron beam evaporation sources.

The electrochromic device of the present application has an effect of improving the electrochromic rate and stability. Such an electrochromic device can be advantageously used in various devices such as smart windows, smart mirrors, displays, electronic papers and adaptive camouflage. The method of constructing such a device is not particularly limited, and as long as the electrochromic device of the present application is applied, a conventional method can be applied.

Advantageous Effects

The present application can provide an electrochromic device having increased productivity, and improved electrochromic rate and durability. Such an electrochromic device can be advantageously used in various devices such as smart windows, smart mirrors, displays, electronic papers, and adaptive camouflage.

BRIEF DESCRIPTION OF DRAWINGS

FIG. 1 illustratively shows an electrochromic device according to one embodiment of the present application.

FIGS. 2 to 5 are current graphs of Examples 1 to 3 and Comparative Example 1, respectively.

FIG. 6 is coloring and bleaching images of Example 1 at 750 cycles.

FIG. 7 is coloring and bleaching images of Example 2 at 750 cycles.

FIG. 8 is a coloring image of Example 3 at 400 cycles.

FIGS. 9 to 11 are charge amount graphs of Examples 1 to 3, respectively.

FIGS. 12 to 14 are transmittance and charge amount graphs of Examples 1 to 3, respectively.

FIGS. 15 to 16 are charge amount graphs of Example 2 and Comparative Example 2, respectively.

FIG. 17 is a coloring image of Comparative Example 2 at 50 cycles.

FIG. 18 is a transmittance and charge amount graph of Comparative Example 2.

MODE FOR INVENTION

Hereinafter, the contents of the present application will be described in more detail through Examples and Comparative Examples, but the scope of the present application is not limited to the following contents.

Measurement Example 1

The thin film density of the electrochromic layer was measured by one second every 0.002 degrees from 0.2 degrees to 2.4 degrees of 2 theta using XRR (X-ray reflectometry) analysis method.

Example 1

Stack: Glass/ITO/WOx (1)/WOx (2)/GPE/LiNixOy/ITO/PET Film

Manufacture of Working Electrode

A first electrochromic layer (121) was formed by forming plasma on a W (tungsten) target by using a DC sputter on an ITO layer laminated on a glass substrate and injecting Ar and $O_2$ gas into a chamber through an active reaction such that the WOx (tungsten oxide) was provided in a form of a thin film having a thickness of about 30 nm. A second electrochromic layer (122) was formed on the first electrochromic layer (121) by the electron beam evaporation setting the WOx source at a high voltage of 6.03 kV and an evaporation rate of 0.5 nm/sec such that the WOx (tungsten oxide) was provided in a form of a thin film having a thickness of about 150 nm. The first electrochromic layer (121) has a density of about 6.3±0.1 $g/cm^3$, and the second electrochromic layer (122) has a density of about 5.8±0.1 $g/cm^3$.

Manufacture of Counter Electrode

An ion storage layer (22) was formed by forming plasma on a $LiNiO_2$ target using a DC sputter on an ITO layer laminated on a PET film and injecting Ar and $O_2$ gas into a chamber through an active reaction such that the LiNixOy was provided in a form of a thin film having a thickness of about 75 nm.

Manufacture of Electrochromic Device

Using a gel polymer electrolyte comprising a mixture of PC (propylene carbonate) and $LiClO_4$, an electrochromic device was manufactured by bonding the working electrode and the counter electrode together such that the second electrochromic layer (122) and the ion storage layer (22) were in contact with the gel polymer electrolyte (3).

Example 2

Stack: Glass/ITO/WOx (1)/WOx (2)/GPE/LiNixOy/ITO/PET Film

An electrochromic device was manufactured in the same manner as in Example 1, except that in forming the first electrochromic layer (121) in Example 1, it was provided in a form of a thin film having a thickness of about 60 nm by increasing the DC sputter time twice. The first electrochromic layer thin film (121) has a density of about 6.3±0.1 $g/cm^3$, and the second electrochromic layer thin film (122) has a density of about 5.8±0.1 $g/cm^3$.

Example 3

Stack: Glass/ITO/WOx (1)/WOx (2)/GPE/LiNixOy/ITO/PET Film

An electrochromic device was manufactured in the same manner as in Example 1, except that in forming the first electrochromic layer thin film (121) in Example 1, it was provided in a form of a thin film having a thickness of about 90 nm by increasing the DC sputter time three times. The first electrochromic layer thin film (121) has a density of about 6.3±0.1 $g/cm^3$, and the second electrochromic layer thin film (122) has a density of about 5.8±0.1 $g/cm^3$.

Comparative Example 1

Stack: Glass/ITO/WOx/GPE/LiNixOy/ITO/PET Film

An electrochromic device was manufactured in the same manner as in Example 1, except that in manufacturing the working electrode and forming the first electrochromic layer thin film (121) in Example 1, the electrochromic layer was formed in a single layer structure of a thin film having a thickness of about 420 nm by increasing the DC sputter time fourteen times. The electrochromic layer thin film has a density of about 6.3±0.1 $g/cm^3$.

Comparative Example 2

Stack: Glass/ITO/WOx (2)/WOx (1)/GPE/LiNixOy/ITO/PET Film

An electrochromic device was manufactured in the same manner as in Example 2, except that in manufacturing the working electrode in Example 2, the second electrochromic layer (122) having a density of about 5.8±0.1 $g/cm^3$ was first formed on the ITO electrode layer, and the first electrochromic layer (121) having a density of about 6.3±0.1 $g/cm^3$ was formed on the second electrochromic layer (122).

Drive and Degradation Evaluation of Electrochromic Device

The electrochromic device manufactured in Examples and Comparative Examples were driven under the following conditions to evaluate presence of degradation, and the results were shown in FIGS. 2 to 9.

Driving Bias: AC voltage of −2 to +2 V

Duration Time: 100 s (coloring)–100 s (bleaching)

FIGS. 2 to 5 show changes in the current amount of the electrochromic devices of Examples 1 to 3 and Comparative Example 1 upon coloring and bleaching according to the elapsed time and the cycle number, respectively. As shown in FIGS. 2 to 5, in Comparative Example 1, degradation occurs after 100 cycles, while in Examples 1 and 2, degradation does not occur even at 800 cycles or more and in Example 3, degradation does not occur up to about 150 cycles, and thus it can be confirmed that Example 3 has superior durability to that of Comparative Example 1. FIGS. 7 and 8 are coloring and bleaching images of the electrochromic devices of Examples 1 and 2 after driving 750 cycles, respectively, and FIG. 9 is a coloring image of Example 3 after driving 400 cycles. In Example 3, degradation proceeded at 400 cycles and there was no color difference between coloring and bleaching. FIGS. 9 to 11 show changes in the charge amount of the electrochromic devices of Examples 1 to 3 upon coloring and bleaching according to the elapsed time, respectively. As the charge amount increases, it may mean that Li+ ions contribute highly to coloring and bleaching or electrochromism. As shown in FIGS. 9 and 11, it can be confirmed that in the case of Examples 1 and 2, the electrochromic devices exhibit the stable electrochromic characteristics up to about 750 cycles without decreasing the charge amount. FIGS. 12 to 14 show changes in the transmittance and the charge amount of the electrochromic devices of Examples 1 to 3 upon coloring and bleaching according to the cycle number, respectively.

FIGS. 15 to 16 show changes in the charge amount of the electrochromic devices of Example 2 and Comparative Example 2 upon coloring and bleaching according to the elapsed time, respectively. As shown in FIGS. 15 to 16, it can be confirmed that in Example 2, the electrochromic device shows stable electrochromic characteristics without decreasing the charge amount according to the elapsed time, whereas in Comparative Example 2, the charge amount decreases after 50 cycles. FIG. 17 is a coloring image of Comparative Example 2 after driving 50 cycles. In Comparative Example 2, degradation proceeded after driving 50 cycles and there was no color difference between coloring and bleaching. FIG. 18 shows changes in the transmittance and the charge amount of the electrochromic device of Comparative Example 2 upon coloring and bleaching according to the cycle number.

EXPLANATION OF REFERENCE NUMERALS

10: first substrate, 11: first electrode layer, 12: composite electrochromic layer, 122: second electrochromic layer, 121: first electrochromic layer, 20: second substrate, 21: second electrode layer, 22: ion storage layer, 3: electrolyte layer

The invention claimed is:

1. An electrochromic device sequentially comprising a first electrode layer, a composite electrochromic layer, an electrolyte layer, an ion storage layer and a second electrode layer, wherein said composite electrochromic layer comprises a laminate structure of a plurality of electrochromic layers, at least two electrochromic layers among said plurality of electrochromic layers have densities different from each other, and the electrochromic layer having a higher density among said at least two electrochromic layers having different densities is disposed closer to said first electrode layer than the electrochromic layer having a lower density, wherein each of said two electrochromic layers comprises metal oxide and said two electrochromic layers have a density difference of 0.1 g/cm$^3$ or more, and wherein said electrochromic layer having the higher density has a density of 5.0 g/cm$^3$ to 8.0 g/cm$^3$.

2. The electrochromic device according to claim 1, wherein said two electrochromic layers having different densities are driven adjacent to each other.

3. The electrochromic device according to claim 1, wherein said two electrochromic layers having different densities are directly laminated to each other.

4. The electrochromic device according to claim 1, wherein said electrochromic layer having the lower density has a density of 3.0 g/cm$^3$ to 7.0 g/cm$^3$.

5. The electrochromic device according to claim 1, wherein each of said two electrochromic layers having different densities has a thickness of 10 nm to 800 nm.

6. The electrochromic device according to claim 1, wherein said electrochromic layer having the lower density is a porous film as compared to said electrochromic layer having the higher density.

7. The electrochromic device according to claim 1, wherein each of said two electrochromic layers having different densities comprises at least one metal oxide of metal oxides of tungsten (W), titanium (Ti), vanadium (V), molybdenum (Mo), niobium (Nb), chromium (Cr), manganese (Mn), iron (Fe), nickel (Ni), cobalt (Co), iridium (Ir) and lithium nickel (LiNi).

8. The electrochromic device according to claim 1, wherein each of said two electrochromic layers having different densities comprises the same kind of electrochromic material.

9. The electrochromic device according to claim 1, wherein said ion storage layer comprises an oxidatively conductive material when the composite electrochromic layer comprises a reductively electrochromic material, or a reductively conductive material when the composite electrochromic layer comprises an oxidatively electrochromic material.

10. The electrochromic device according to claim 1, wherein said electrolyte layer comprises an electrolyte salt, and said electrode layer comprises a transparent conductive material.

11. A method for manufacturing an electrochromic device, comprising a process of sequentially laminating on a first electrode layer a composite electrochromic layer, an electrolyte layer, an ion storage layer and a second electrode layer, wherein said composite electrochromic layer comprises a laminate structure of a plurality of electrochromic layers, and at least two electrochromic layers among said plurality of electrochromic layers have densities different from each other and are laminated such that the electrochromic layer having a higher density among said two electrochromic layers having different densities is disposed adjacent to said first electrode layer as compared to the electrochromic layer having a lower density, wherein each of said two electrochromic layers comprises metal oxide and said two electrochromic layers have a density difference of 0.1 g/cm$^3$ or more, and wherein said electrochromic layer having the higher density has a density of 5.0 g/cm$^3$ to 8.0 g/cm$^3$.

12. The method for manufacturing the electrochromic device according to claim 11, wherein the adjustment of density in said plurality of electrochromic layers to be different from each other is performed by laminating any one electrochromic layer among said plurality of electrochromic layers in the form of a porous film as compared to any other electrochromic layer.

13. The method for manufacturing the electrochromic device according to claim 12, wherein the lamination of said electrochromic layer in the form of a porous film is performed by applying a sputtering process thereto, with a proviso that the process pressure condition is adjusted, or by applying an electron beam evaporation process thereto, with a proviso that the gas condition is adjusted.

* * * * *